(12) United States Patent
Yang et al.

(10) Patent No.: US 11,239,832 B1
(45) Date of Patent: Feb. 1, 2022

(54) LOW-SKEW COMPLEMENTARY SIGNAL GENERATOR

(71) Applicant: MACRONIX INTERNATIONAL CO., LTD., Hsinchu (TW)

(72) Inventors: Shang-Chi Yang, Changhua (TW); Jhen-Sheng Chih, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 17/223,372

(22) Filed: Apr. 6, 2021

(51) Int. Cl.
*H03K 5/125* (2006.01)
*H03K 17/687* (2006.01)
*H03K 19/20* (2006.01)

(52) U.S. Cl.
CPC ......... *H03K 5/125* (2013.01); *H03K 17/6872* (2013.01); *H03K 19/20* (2013.01)

(58) Field of Classification Search
CPC .............................. H03K 17/6872; H03K 19/20
USPC .......................................... 327/551, 170–176
See application file for complete search history.

(56) References Cited

U.S. PATENT DOCUMENTS

| 6,420,920 | B1* | 7/2002 | Huber | G11C 7/225 327/239 |
| 2009/0284291 | A1* | 11/2009 | Teramoto | H03K 5/151 327/158 |
| 2020/0266185 | A1 | 8/2020 | Mittal et al. | |

* cited by examiner

*Primary Examiner* — Tomi Skibinski
(74) *Attorney, Agent, or Firm* — Haynes Beffel & Wolfeld LLP

(57) ABSTRACT

A circuit to generate complementary signals comprises a first string of inverters with two inverters in series to produce a true signal in response to an input signal, and a second string of inverters with three inverters in series to produce a complement signal in response to the input signal. A compensation capacitance circuit is connected to a node in the first string of inverters. The compensation capacitance circuit can add capacitance to the node to increase a resistance-capacitance RC delay at the node in a manner which emulates the delay across PVT conditions an inverter in the second string of inverters.

21 Claims, 5 Drawing Sheets

FIG. 6A
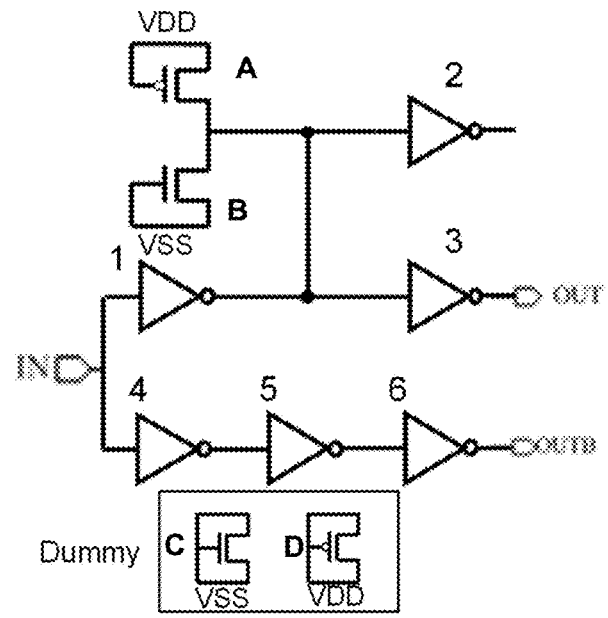
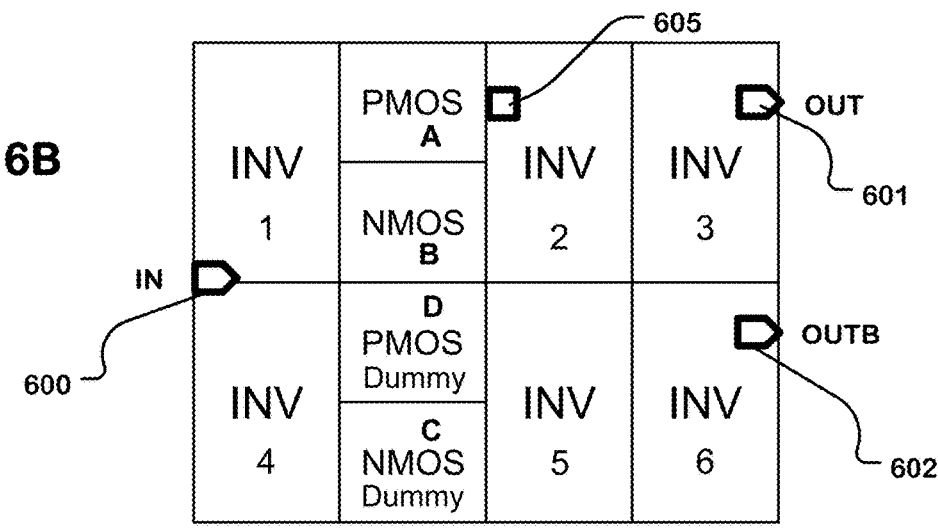
FIG. 6B
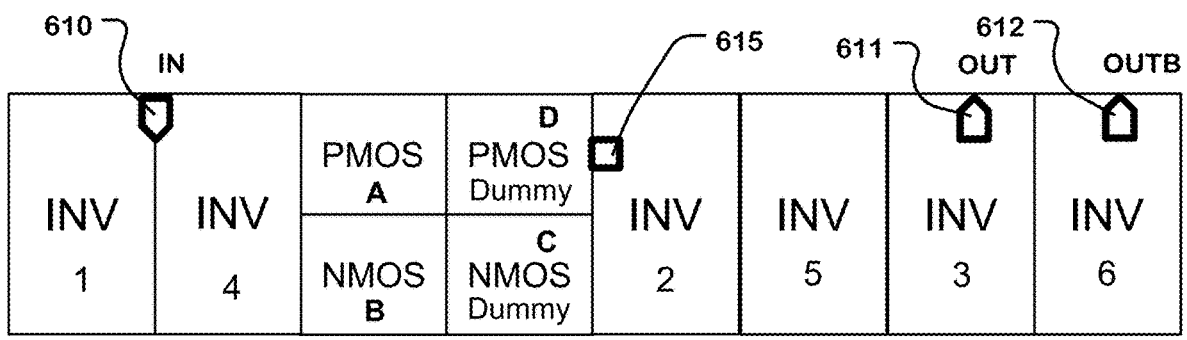
FIG. 6C

LOW-SKEW COMPLEMENTARY SIGNAL GENERATOR

BACKGROUND

Field

The present invention relates to complementary signal generators for integrated circuits, and particularly low-skew complementary signal generators.

Description of Related Art

A complementary signal generator is a component of many circuit designs used in integrated circuits and other environments. A complementary signal generator receives a single ended signal on an input, often referenced to ground, and produces true and complement signals on respective outputs. The true and complement signals can be used as in-phase and anti-phase components of a differential signal, such as for driving a two-wire transmission line without a ground reference. Also, the true and complement signals can be used as separate, single ended signals, applied, for example, as complementary clock signals to different flip-flops in a logic circuit, or different enable signals to different synchronized components of a circuit.

One way to implement a complementary signal generator is to provide two inverter strings, one string with two inverters in series to produce a true signal, and one string with three inverters in series to produce a complement signal. This extra inverter introduces additional delay in the transition of the complement signal relative to the true signal, introducing skew between the complementary signals.

The skew can be reduced by adding a pass gate in the string of inverters producing the true signal. The pass gate introduces slight delay that can compensate for the delay in the third inverter of the string of inverters producing the complement signal. In this approach, the skew, while reduced generally, can suffer substantial variation in different process, voltage and temperature PVT conditions.

As the frequency of operation of electronic circuits increases, skew between the true and complement signals can become more critical.

It is desirable to provide technology that can improve complementary signal generators including reducing skew, and reducing variations in skew, in different PVT conditions.

SUMMARY

For the purposes of introduction, aspects of a complementary signal generator described herein include a first string of inverters with an even number (e.g. 2, 4) of inverters in series to produce a true signal on node OUT and a second string of inverters with an odd number (e.g. 1, 3) of inverters in series to produce a complement signal on node OUTB. A compensation capacitance circuit is connected to a node in the one of the first and second strings having the smaller number of inverters.

In an aspect of the technology described herein, the compensation capacitance circuit can include a component emulating junction and overlap capacitance of one of the inverters, and a component emulating input load of one of the inverters.

A circuit is described which can generate true and complement signals having reduced skew, and reduced variations in skew, across different PVT conditions.

In another aspect, a macrocell for implementation of the circuit is described.

In another aspect, an output buffer for an integrated circuit is provided, including a complementary signal generator as described herein.

Other aspects and advantages of the present invention can be seen on review of the drawings, the detailed description and the claims, which follow.

BRIEF DESCRIPTION OF THE DRAWINGS

FIG. 6A is a legend for layout diagrams shown in FIGS. 6B and 6C, for a circuit to generate complementary signals as described with reference to FIG. 3.

FIG. 6B is a first alternative standard macrocell layout of a circuit like that of FIG. 3.

FIG. 6C is a second alternative standard macrocell layout of a circuit like that of FIG. 3.

DETAILED DESCRIPTION

A detailed description of embodiments of the present invention is provided with reference to the FIGS. 1-7.

Circuits for generating differential signals can be implemented using two strings of inverters connected to a common input. One of the strings of inverters has two inverters in series, and produces a true signal on its output delayed slightly relative to the input signal by the signal propagation time through the inverter string. The other of the two strings of inverters has three inverters in series, and produces a complement signal on its output also delayed relative to the input signal by the signal propagation time through the inverter string. Because the numbers of inverters in the two strings are different, the delay through the inverter strings are also different, introducing skew between the true signal and the complement signal. In order to reduce the skew, a pass gate can be introduced between the two inverters in the string producing the true signal. The pass gate increases the delay through the string so that it may more closely match the delay through the string producing the complement signal, thereby reducing skew.

Figure 1:
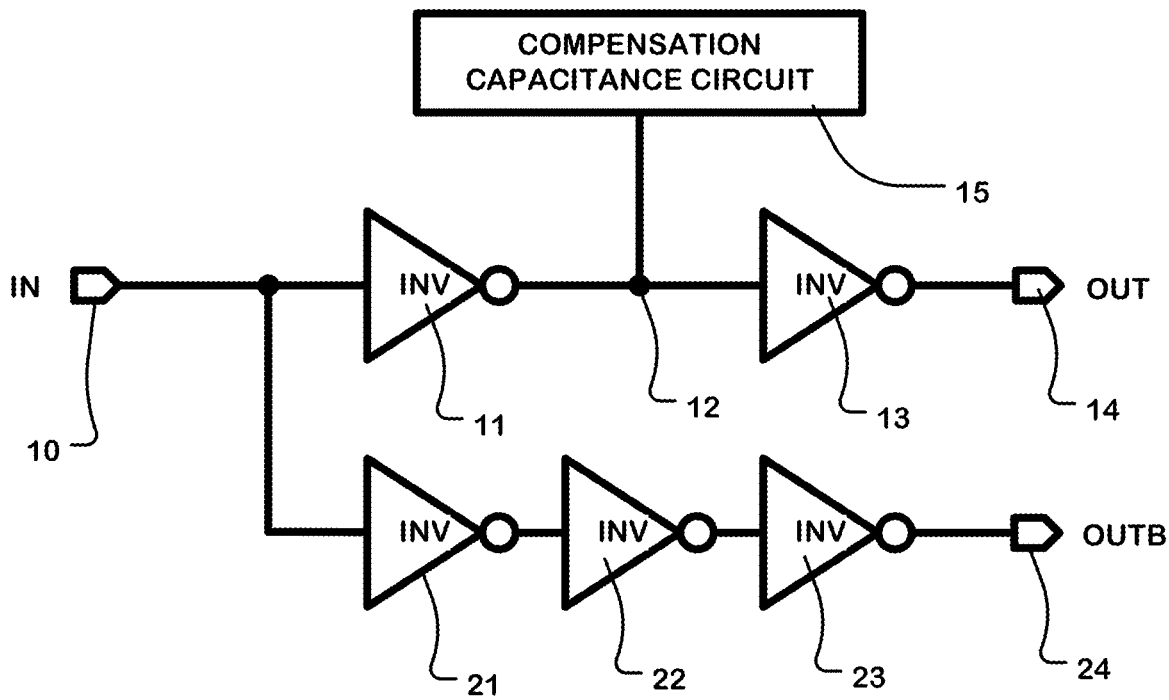
FIG. 1 is a schematic diagram of the circuit to generate complementary signals as described herein.

FIG. 1 illustrates a circuit for generating differential signals which can have further reduced skew, and which can have less variation in skew across PVT conditions.

The circuit includes a first string of inverters arranged in series, and a second string of inverters arranged in series. The first string of inverters includes a first inverter 11 having an input connected to the input node 10 and output connected to node 12. The first string of inverters includes a second inverter 13 having an input connected to node 12, and output connected to node 14. Node 14 is an output node OUT of the circuit on which a true signal is provided.

The second string of inverters includes a first inverter 21, a second inverter 22 and a third inverter 23. The first inverter 21 has an input coupled to the input node 10 and an output connected an input of the second inverter 22. The second inverter 22 has an output connected to an input of the third inverter 23. The output of the third inverter 23 is connected to node 24. Node 24 is an output node OUTB of the circuit on which a complement signal is provided.

A compensation capacitance circuit 15 is connected to node 12. Unlike a pass gate which would include active elements in the current flow path from the output of one inverter to the input of a next inverter in the first string of inverters, the compensation capacitance circuit 15 does not include an active element in the current flow path between the inverters in the string. Rather, the compensation capacitance circuit can be configured to connect to node 12, which is connected passively to the output of the first inverter 11 and to the input of the second inverter 13.

The compensation capacitance circuit 15 is a means for adding capacitance to node 12, increasing a resistance-capacitance RC delay at the node 12 in a manner which emulates the delay across PVT conditions of the second inverter 22 in the second string of inverters.

The circuit illustrated in FIG. 1 includes two inverters in the first string producing the true signal, and three inverters in the second string producing the complement signal. This circuit design can be extended to a first string of inverters including an even number (2, 4, . . . ) of inverters, and a second string of inverters including an odd number (1, 3, . . . ) of inverters. The compensation capacitance circuit is connected to a node in the string of inverters having the smallest number of inverters.

Figure 2:
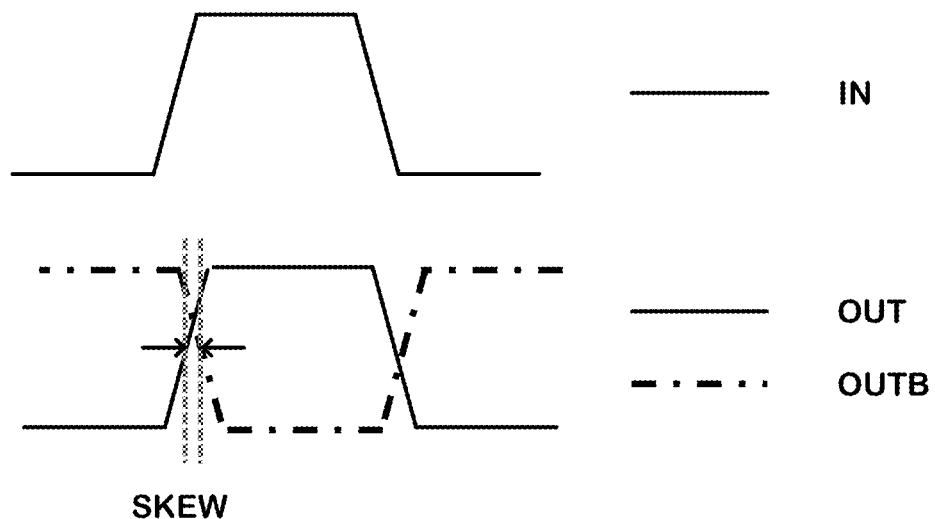
FIG. 2 is a timing diagram illustrating timing skew between the true and complement signals output by the circuit of FIG. 1.

FIG. 2 illustrates timing of the true signal and the complement signal on the outputs OUT and OUTB relative to the input signal on the input IN. As illustrated, as the input signal transitions from a low value to a high value, the true signal on the output OUT transitions from low to high after a short latency. Likewise, the complement signal on the output OUTB transitions from high to low after a short latency. The difference in these latencies is termed skew which, as illustrated in FIG. 2, is typically measured by the timing difference between the point at which the signals cross a midpoint between the high and low values, sometimes referred to as a half maximum.

Figure 3:
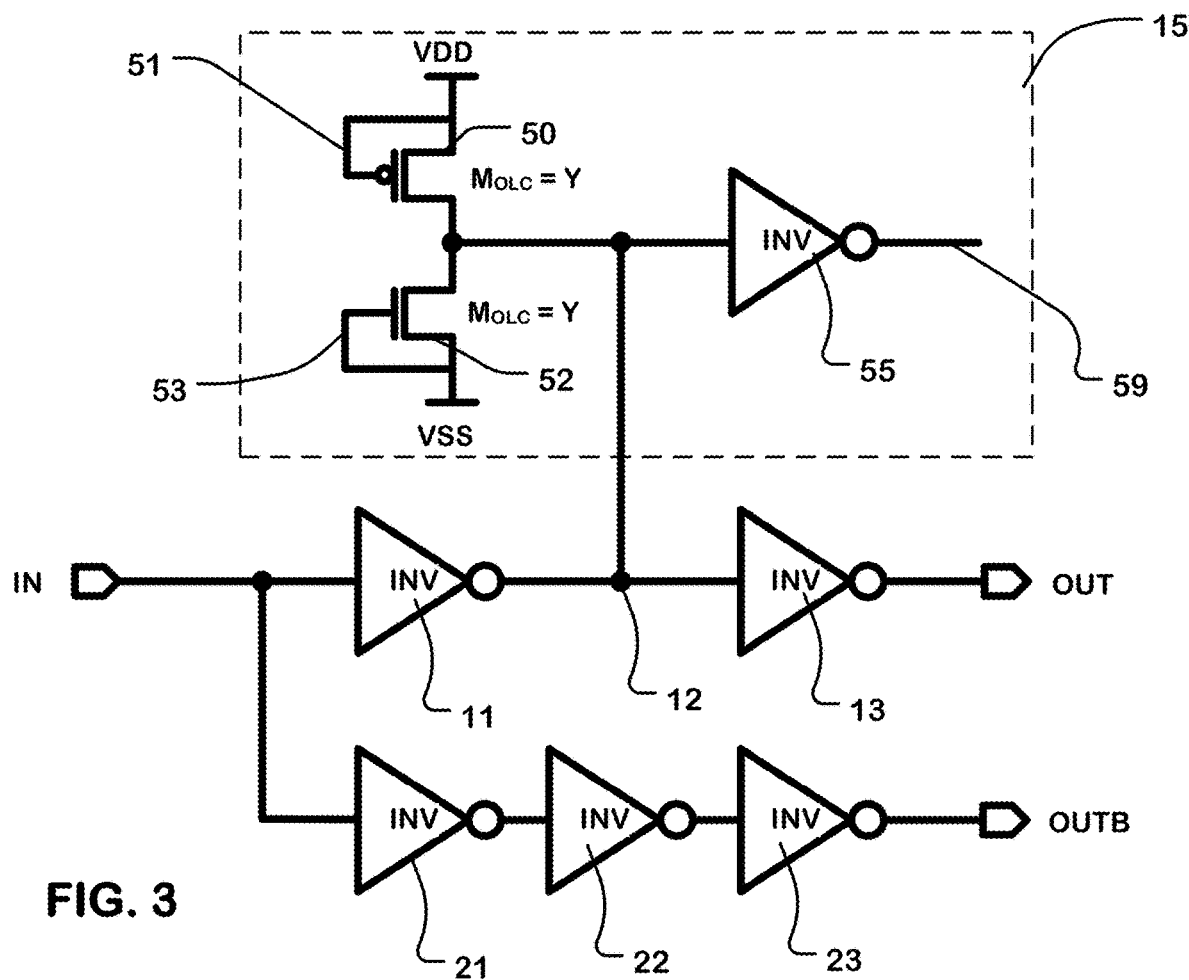
FIG. 3 is a more detailed schematic diagram of a circuit to generate complementary signals, including a compensation capacitance circuit as described herein.

FIG. 3 illustrates the circuit of FIG. 1 with more details of an embodiment of a compensation capacitance circuit 15. The reference numerals in FIG. 3 match those of FIG. 1 for like components.

The compensation capacitance circuit 15 includes PMOS transistor 50 having a source connected to power supply node VDD and a drain connected to node 12. Also, the circuit 15 includes NMOS transistor 52 having a source connected to the reference supply node VSS and a drain connected to node 12. The gate of PMOS transistor 50 is connected by line 51 to its source. Likewise, the gate of NMOS transistor 52 is connected by line 53 to its source.

The compensation capacitance circuit 15 includes inverter 55 having an input connected to node 12 and an output at line 59, which may be left unconnected, or floating, in some embodiments. In other embodiments, the output at line 59 may be connected to other circuit elements on the device.

The compensation capacitance circuit 15 in FIG. 3 includes a first component that comprises PMOS transistor 50 and NMOS transistor 52, in this example, which emulates a gate-to-drain overlap capacitance and junction capacitance at the output of an inverter, such as the output of the standard inverter cell structure.

The compensation capacitance circuit 15 in FIG. 3 includes a second component that comprises inverter 55, in this example, which emulates the input node capacitance of an inverter, such as the input load of a standard inverter cell structure.

Figure 4:
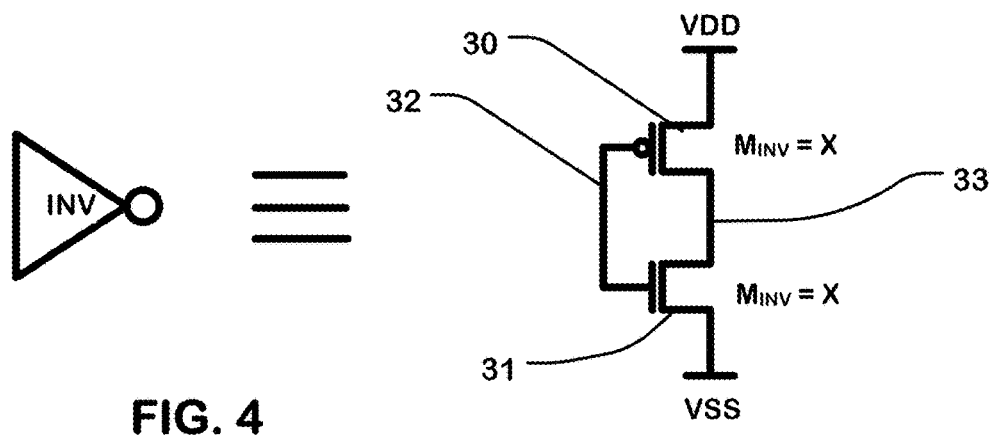
FIG. 4 illustrates a standard cell representation of an inverter as used in the circuit of FIG. 3.

FIG. 4 illustrates the equivalent circuit of the inverters in the circuit of FIG. 3. The inverters each include a PMOS transistor 30 in series with an NMOS transistor 31. The PMOS transistor 30 has a source connected to power supply node VDD and a drain connected to node 33. Also, the NMOS transistor 31 has a source connected to the reference supply node VSS and a drain connected to node 33. The gates of the PMOS transistor 30 and NMOS transistor 31 are connected together on line 32.

Each of the six inverters (11, 55, 13, 21, 22, 23) in the embodiment of FIG. 3 can be implemented in a same layout and structure, such as by using a standard cell structure, so that the transistors utilized in each of the cells have the same size and layout. (The term "standard" implies uniform structure within the same integrated circuit, and not necessarily across different integrated circuits, for the purposes of the present description.) Although the circuit of FIG. 3 is implemented using inverter cells, in some embodiments, one or more of the inverters can be implemented using other logic gate cells, such as NOR gates or NAND gates.

The relative size of the transistors in the overlap capacitance component of the compensation capacitance circuit 15 is represented by the parameter $M_{OLC}$. The relative size of the transistors in the inverters is represented by the parameter $M_{INV}$.

As shown, $M_{OLC}$=Y and $M_{INV}$=X, in these figures. For example, a transistor having value $M_{INV}$=1 can be implemented using a single unit transistor in the standard cell library used to implement the integrated circuit. A transistor having value $M_{INV}$=2, can be implemented using two unit transistors in parallel and so on. Alternatively, a transistor having value $M_{INV}$=2, can be implemented using a transistor having a gate width two times the gate width of the standard unit transistor.

In embodiments of the compensation capacitance circuit, $M_{OLC}$ can be between one and two times $M_{INV}$. Given a standard size $M_{INV}$ of the transistors in the inverters in the circuit, the size $M_{OLC}$ of the transistors (e.g. 50, 52) used to compensate for overlap capacitance, is a function of the relative contribution of overlap capacitance or input load capacitance to the behavior of the circuit. This relative contribution can be determined by, and can be tuned by adjusting, the sizing of components, the placement of components and the routing of interconnects among the components.

If the overlap capacitance is a dominant factor, then Y can be equal to 2x. This can be explained by the behavior of the overlap capacitance of an inverter, in which the input transitions by an amount $\Delta V$ in one direction, while the output transitions quickly by an amount $\Delta V$ in an opposite direction, resulting in a voltage transition of about $2\Delta V$. The charge Q in this transition is equal to the overlap capacitance C times $2\Delta V$ (Q=C$2\Delta V$). This charge Q can be emulated by implementing the transistors in the component emulating overlap capacitance with twice the capacitance, whereby Q=2C$\Delta V$.

In cases in which both gate-to-drain overlap capacitance and junction capacitance contribute significantly, then Y can be larger than 1x, and between 1x and 2x, such as about 1.5×. In some cases, Y can be equal to about X, where "about" in this context means within manufacturing tolerances for structures designed to have the same sizes.

In order to implement a component emulating gate-to-drain overlap capacitance such that Y=1.5×, for example, the circuit of FIG. 3 can be implemented using standard inverters with $M_{INV}$=2, using two unit transistors, and the NMOS transistor 52 and PMOS transistor 50 of $M_{OLC}$=3, can be implemented using three unit transistors.

Generally, one can represent the resistance-capacitance RC delay of each inverter in the series of inverters by a factor "1RC", where the capacitance is a combination of the junction and overlap capacitance K on an output of an inverter and the input load capacitance J of a following inverter, so C=J+K.

Thus, the series including three inverters has a total delay equal to 3RC (assuming J on the node OUTB is the same). The series including two inverters without the compensation capacitance has a total delay equal to 2RC, resulting in a skew caused by the difference of 1RC (assuming J on the node OUT is the same). The compensation capacitance is a means for reducing the skew by increasing the capacitance at node 12 in a manner that tracks PVT variations, so that the total RC delay between IN and OUT through inverters 11 and 13 is 3RC. As a result, the skew is reduced and more consistent across the range of operating conditions specified for the device.

The compensation capacitance circuit accomplishes this 3RC delay by adding capacitance to node 12, so that the delay can be represented by the equation:

$$(1R \times 2C) + 1(RC) = 3RC$$

The first factor represents the output of the first inverter and the compensation capacitance circuit, and the second factor represents the second inverter output.

As to the first factor, inverter 55 contributes one input load capacitance J. Inverter 13 contributes one input load capacitance J. Inverter 11 contributes one junction and overlap capacitance K. Transistors 50 and 52 contribute one junction and overlap capacitance K. The sum is equals 2C as seen by the following:

$$1J+1J+1K+1K=2(J+K)=2C.$$

Figure 5:
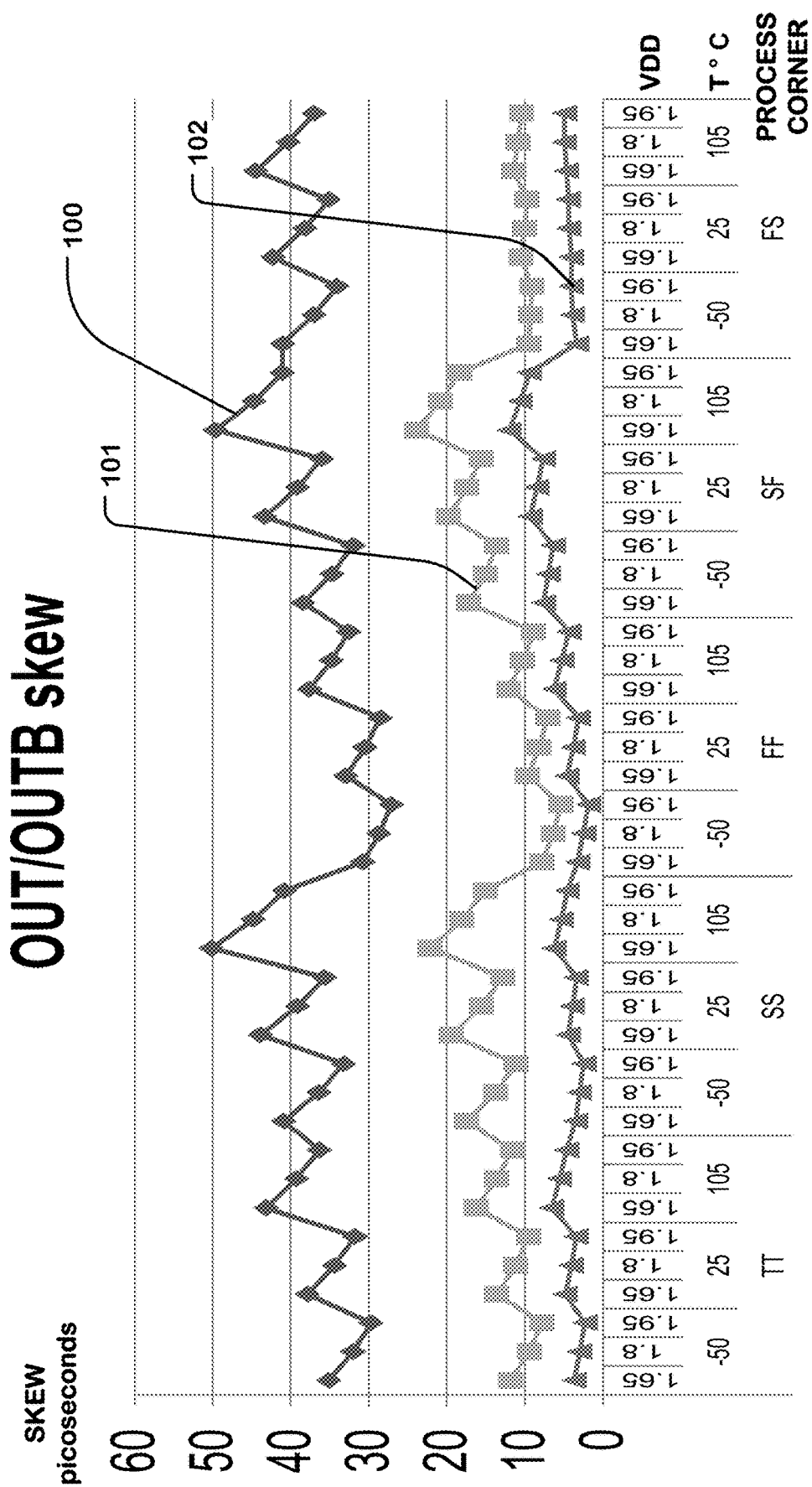
FIG. 5 is a process corner graph of skew for 3 different embodiments of circuits to generate complementary signals across PVT conditions.

FIG. 5 is a process corner chart illustrating skew in picoseconds across PVT conditions, including process corners TT, SS, FF, SF, FS, temperature from −50° C. to +105° C. and power supply voltage from 1.65 V to 1.95 V for three variations of a circuit to generate complementary signals. Trace 100 represents the skew for a circuit as mentioned above using two inverters in series to produce a true signal, and three inverters in series to produce a complement signal. Simulation of this circuit as shown on trace 100 results in skew ranging from about 27 ps to about 50 ps across the PVT conditions. Trace 101 represents skew for a circuit as mentioned above using two inverters and a pass gate in series to produce a true signal, and three inverters in series to produce a complement signal. Simulation of the circuit as shown in trace 101 results in skew ranging from about 6 picoseconds (ps) to about 24 ps across the PVT conditions. Trace 102 represents skew for a circuit as discussed above in connection with FIG. 3. As seen in trace 102, the circuit of FIG. 3 can result in skew ranging from about 2 ps to about 12 ps across the entire range of PVT conditions stimulated. Also, the skew is lower than that of trace 101 across the entire range of PVT conditions stimulated.

A standard cell as used herein, is a group of transistors and interconnect structures that provides a Boolean logic function, which can include a layout, organized into base layers which correspond to the different structures of the transistor devices, and interconnect wiring layers and via layers, which join together the terminals of the transistor formations. The inverters in embodiments of the circuit to generate complementary signals can be implemented using a same standard cell with a same cell structure. The inverters in embodiments of the circuit to generate complementary signals can be implemented using same standard CMOS inverter cells with a same cell structure.

Also, the transistors used in a standard cell can have transistor size, including a layout of gate width and length, and gate overlap, including unit transistor sizes for the NMOS and PMOS transistors, respectively, that are commonly used across the circuit. For the purposes of the present description, a standard macrocell is a group a standard cells and transistors, and interconnect wiring layers and via layers, which join together the terminals of the transistor formations. A circuit to generate complementary signals as described with reference to FIGS. 1 and 3 can be implemented as a standard macrocell and used in a cell library for the purposes of efficient placement on an integrated circuit, and efficient synthesis of integrated circuits utilizing the standard macrocell. Also, in the macrocell, the interconnections typically in metal layers match in length, width and numbers of vias on the two signal paths.

FIGS. 6A-6C include a legend and alternative layout configurations for standard macrocells which can implement a circuit to generate complementary signals as described with reference to FIG. 3.

FIG. 6A is a legend, in which the inverters used in the string used to produce the true signal are labeled with numerals 1, 3, the inverter used in the compensation capacitance circuit is labeled 2, and the inverters used in the string used to produce the complement signal are labeled with numerals 4, 5, 6. The PMOS transistor in the component emulating overlap capacitance is labeled A. The NMOS transistor in the component emulating overlap capacitance is labeled B. Dummy transistors which can, for example, have their gate, source and drain connected together, are labeled C and D and used for layout matching. Also, the interconnections (not shown) typically in metal layers match in length, width and numbers of vias on the two signal paths.

FIG. 6B illustrates a first macrocell layout, including standard cell inverters for all six inverters in the circuit. The layout includes a top row having, in order, a standard inverter cell for inverter 1, cells for transistors A and B, a standard inverter cell for inverter 2, and a standard inverter cell for inverter 3. The layout in FIG. 6B includes a bottom row having, in order, a standard inverter cell for inverter 4, cells for dummy transistors C and D, a standard inverter cell for inverter 5, and a standard inverter cell for inverter 6. The macrocell of FIG. 6B has a rectangular footprint.

The cells for transistors A and B are configured in the layout so that PMOS transistor A is disposed relative to NMOS transistor B in a manner that matches the circuit structure of the standard inverter cell, and consumes about the same amount of area in the layout. The cells for dummy transistors C and D are configured in the layout to match the layout for the cells of transistors A and B.

The macrocell in FIG. 6B has an input node 600. The six standard inverter cells (INV 1 to INV 6) are interconnected to form a first series of inverters having two inverters (INV 1, INV 3) to generate a true signal on a first output node 601 in response to an input signal on the input node, a second series of inverters having three inverters (INV 4, INV 5, INV 6) to generate a complement signal on a second output node 602 in response to an input signal on the input node. The inverter INV 2 has an input connected to a node 605 between the two inverters INV 1 and INV 3 in the first series, and wherein the component (PMOS A and NMOS B) is connected to the node 605 between the two inverters in the first series. Although the circuit of FIG. 6B is implemented using inverter cells, in some embodiments, one or more of the inverters can be implemented using other logic gate cells, such as NOR gates or NAND gates.

The nodes 600, 601, 602, 605 are located in the figure heuristically. In implementation, the nodes can include connection pads for the circuit elements connected to interconnect wiring layers and via layers to form the interconnections within the area of the individual cells. Also, the interconnections (not shown) typically in metal layers match in length, width and numbers of vias on the two signal paths.

FIG. 6C illustrates a second macrocell layout using a single row, including standard cell inverters for all six inverters in the circuit. The single row includes, in order, a standard inverter cell for inverter 1, a standard inverter cell for inverter 4, cells for transistors A and B, cells for dummy transistors C and D, a standard inverter cell for inverter 2, a standard inverter cell for inverter 5, a standard inverter cell for inverter 3, and a standard inverter cell for inverter 6. As with FIG. 6B, in FIG. 6C, the cells for transistors A and B are configured in the layout so that PMOS transistor A overlies NMOS transistor B in a manner that matches the circuit structure of the standard inverter cell and consumes about the same amount of area in the layout. The cells for dummy transistors C and D are configured in the layout to match the layout for the cells of transistors A and B. The macrocell of FIG. 6C has a rectangular footprint. Also, the interconnections (not shown) typically in metal layers match in length, width and numbers of vias on the two signal paths.

The macrocell in FIG. 6C has an input node 610. The six standard inverter cells (INV 1 to INV 6) are interconnected to form a first series of inverters having two inverters (INV 1, INV 3) to generate a true signal on a first output node 611 in response to an input signal on the input node, a second series of inverters having three inverters (INV 4, INV 5, INV 6) to generate a complement signal on a second output node 612 in response to an input signal on the input node. The inverter INV 2 has an input connected to a node 615 between the two inverters INV 1 and INV 3 in the first series, and wherein the component (PMOS A and NMOS B) is connected to the node 615 between the two inverters in the first series. Although the circuit of FIG. 6C is implemented using inverter cells, in some embodiments, one or more of the inverters can be implemented using other logic gate cells, such as NOR gates or NAND gates.

The nodes 610, 611, 612, 615 are located in the figure heuristically. In implementation, the nodes can include connection pads for the circuit elements, with connection to overlying patterned conductor layers which form the interconnections within the area of the individual cells.

Macrocells, like those described with reference to FIGS. 6B and 6C, can be implemented using a machine-readable entry in a cell library comprising electronic design automation instructions, which define a geometry of the macrocell. Accordingly, an embodiment of the technology includes machine readable instructions stored in non-transistor computer readable memory, implemented using electronic design automation instructions.

Figure 7:
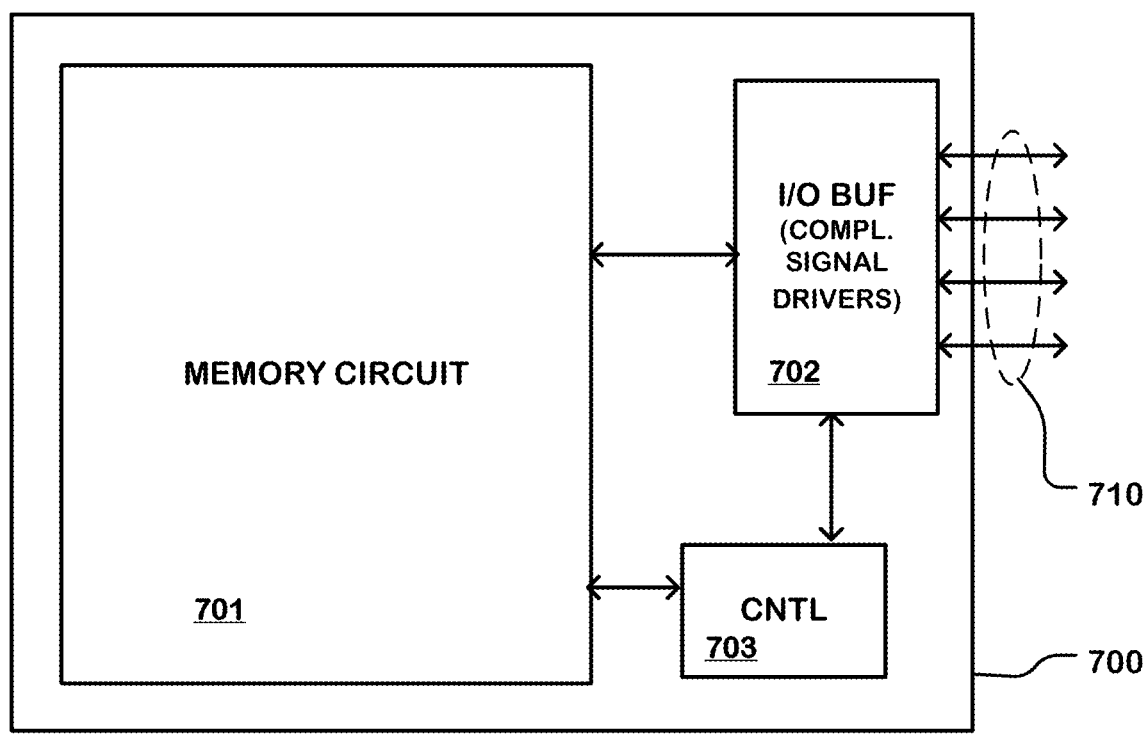
FIG. 7 is a simplified diagram of an integrated circuit memory device including circuits to generate complementary signals as described herein.

FIG. 7 is a simplified diagram of an integrated circuit including a circuit for generating complementary signals as described herein. The example of FIG. 7 is an integrated circuit 700 including a memory circuit 701, control circuitry 703, and an input/output I/O buffer 702. The input/output buffer 702 provides for communication of data between the memory circuit 701 and I/O pins 710 on the device. The control circuitry 703 includes state machines, decoders and other peripheral circuitry used for operation of the memory circuit and for control of the I/O buffer. The integrated circuit 700, in some embodiments, includes a plurality of circuits to generate complementary signals, including one or more in the input buffer of I/O buffer 702 and one or more in the output buffer of I/O buffer 702. In some embodiments, the plurality of circuits to generate complementary signals are implemented using a corresponding plurality of standard macrocells.

The circuits for generating complementary signals can be used as complementary signal drivers, such as utilized, for example, to implement nonvolatile double data rate version four NV DDR4 and version three NV DDR3 interface standards. The technology described herein can be applied in DRAM, SRAM, and other memory system interfaces.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A circuit to generate complementary signals, comprising:
   a first string of inverters with an even number of inverters in series to produce a true signal in response to an input signal, and a second string of inverters with an odd number of inverters in series to produce a complement signal in response to the input signal;
   one of the first and second strings having a smaller number of inverters; and
   a compensation capacitance circuit connected to a node in the one of the first and second strings having the smaller number of inverters; wherein the compensation capacitance circuit includes a first component emulating overlap capacitance of an output node of one of the inverters, and a second component emulating input load capacitance at an input node of one of the inverters.

2. The circuit of claim 1, wherein the first component emulates overlap and junction capacitance of an output node of one of the inverters.

3. The circuit of claim 1, wherein the inverters in the first and second strings are CMOS inverter cells with a same cell structure.

4. The circuit of claim 1, wherein at least one of the inverters in the inverters in the first and second strings includes a PMOS transistor in series with an NMOS transistor having gates connected together, and the first component of the compensation capacitance circuit includes a PMOS transistor having a gate connected to its source terminal, in series with an NMOS transistor having a gate connected to its source terminal.

5. The circuit of claim 4, wherein the second component of the compensation capacitance circuit includes an inverter.

6. The circuit of claim 4, wherein the NMOS transistor in the at least one of the inverters has a first relative transistor size M=X, and the NMOS transistor in the compensation capacitance circuit has a second relative transistor size M=Y, where Y>X.

7. The circuit of claim 6, where Y=about 2x.

8. The circuit of claim 4, wherein the NMOS transistor in the at least one of the inverters has a first relative transistor size M=X, and the NMOS transistor in the compensation capacitance circuit has a second relative transistor size M=Y, where Y=about X.

9. The circuit of claim 4, wherein the PMOS transistor in the at least one of the inverters has a first relative transistor size M=X, and the PMOS transistor in the compensation capacitance circuit has a second relative transistor size M=Y, where Y>X.

10. The circuit of claim 4, wherein the PMOS transistor in the at least one of the inverters has a first relative transistor size M=X, and the PMOS transistor in the compensation capacitance circuit has a second relative transistor size M=Y, where Y=about X.

11. A circuit to generate complementary signals, comprising:
a first string of inverters with an even number of inverters in series to produce a true signal in response to an input signal, and a second string of inverters with an odd number of inverters in series to produce a complement signal in response to the input signal;
one of the first and second strings having a smaller number of inverters; and
a compensation capacitance circuit connected to a node in the one of the first and second strings having the smaller number of inverters, wherein at least one of the inverters in the inverters in the first and second strings includes a PMOS transistor in series with an NMOS transistor having gates connected together, and the compensation capacitance circuit includes:
a PMOS transistor having a gate connected to its source terminal, and a drain terminal connected to the node, and an NMOS transistor having a gate connected to its source terminal and a drain terminal connected to the node; and
an inverter having an input connected to the node.

12. An integrated circuit, comprising:
a macrocell comprising six standard inverter cells having two transistors each and four transistors, one of the standard inverter cells and two of the four transistors being configured as a compensation capacitance circuit, and five of the six standard inverter cells being arranged in a circuit to generate complementary signals.

13. The integrated circuit of claim 12, wherein the four transistors of the macrocell include two transistors to emulate overlap capacitance of the output of one of the five standard inverter cells and two dummy transistors arranged in the macrocell for layout matching.

14. The integrated circuit of claim 12, wherein the macrocell has a rectangular footprint.

15. The integrated circuit of claim 12, wherein the six standard inverter cells are interconnected to form a first series of inverters having two inverters, a second series of inverters having three inverters, and the one of the standard inverter cells in the compensation capacitance circuit having an input connected to a node between the two inverters in the first series, and the two transistors to emulate overlap capacitance are connected to the node between the two inverters in the first series.

16. The integrated circuit of claim 12, wherein the macrocell has an input node, and the six standard inverter cells are interconnected to form a first series of inverters having two inverters to generate a true signal on a first output node in response to an input signal on the input node, a second series of inverters having three inverters to generate a complement signal on a second output node in response to an input signal on the input node.

17. The integrated circuit of claim 12, wherein the integrated circuit includes a plurality of standard macrocells arranged in a circuit to generate complementary signals, said first mentioned macrocell being one of the plurality of standard macrocells.

18. The integrated circuit of claim 12, comprising an output buffer including said macrocell.

19. The integrated circuit of claim 12, comprising an input buffer including said macrocell.

20. A circuit to generate complementary signals, comprising:
a first string of inverters with an even number of inverters in series to produce a true signal in response to an input signal, and a second string of inverters with an odd number of inverters in series to produce a complement signal in response to the input signal;
one of the first and second strings having a smaller number of inverters; and
means for adding capacitance to a node in said one of the first and second strings having a smaller number of inverters, to emulate overlap capacitance of an output node of one of the inverters, and to emulate input load capacitance at an input node of one of the inverters, to increase a resistance-capacitance RC delay at the node in a manner which emulates the delay across PVT conditions in an inverter in the other string of inverters.

21. A circuit to generate complementary signals, comprising:
a first string of inverters with an even number of inverters in series to produce a true signal in response to an input signal, and a second string of inverters with an odd number of inverters in series to produce a complement signal in response to the input signal;
one of the first and second strings having a smaller number of inverters; and
a compensation capacitance circuit connected to a node in the one of the first and second strings having the smaller number of inverters;
wherein at least one of the inverters in the inverters in the first and second strings includes a PMOS transistor in series with an NMOS transistor having gates connected together, and the compensation capacitance circuit includes a PMOS transistor having a gate connected to its source terminal, in series with an NMOS transistor having a gate connected to its source terminal.

* * * * *